(12) United States Patent
Qi et al.

(10) Patent No.: US 12,464,687 B2
(45) Date of Patent: Nov. 4, 2025

(54) VEHICLE CONTROLLER AND VEHICLE HAVING SAME

(71) Applicant: BYD COMPANY LIMITED, Guangdong (CN)

(72) Inventors: Axi Qi, Shenzhen (CN); Xingchun Zhang, Shenzhen (CN); Fengchuan Yu, Shenzhen (CN); Qinghui Zeng, Shenzhen (CN)

(73) Assignee: BYD Company Limited, Shenzhen (CN)

( * ) Notice: Subject to any disclaimer, the term of this patent is extended or adjusted under 35 U.S.C. 154(b) by 224 days.

(21) Appl. No.: 18/373,239

(22) Filed: Sep. 26, 2023

(65) Prior Publication Data

US 2024/0023290 A1 Jan. 18, 2024

Related U.S. Application Data

(63) Continuation of application No. PCT/CN2022/084261, filed on Mar. 31, 2022.

(30) Foreign Application Priority Data

Jun. 18, 2021 (CN) .......................... 202110679816.1

(51) Int. Cl.
*H05K 7/20* (2006.01)
*H05K 5/02* (2006.01)
(Continued)

(52) U.S. Cl.
CPC ....... *H05K 7/20872* (2013.01); *H05K 5/0217* (2013.01); *H05K 5/03* (2013.01); *H05K 9/0007* (2013.01)

(58) Field of Classification Search
CPC . H05K 7/20872; H05K 5/0217; H05K 9/0007
See application file for complete search history.

(56) References Cited

U.S. PATENT DOCUMENTS

| 5,491,370 A | 2/1996 | Schneider et al. |
| 10,736,242 B2 * | 8/2020 | Fang ..................... H02M 7/003 |

(Continued)

FOREIGN PATENT DOCUMENTS

| CN | 106553562 A | 4/2017 |
| CN | 107734941 A | 2/2018 |

(Continued)

OTHER PUBLICATIONS

CN 211880874 U, English translation. (Year: 2020).*
International Search Report and Written Opinion for Application No. PCT/CN2022/084261, mailed on Jun. 22, 2022, 9 pages.

*Primary Examiner* — Mukundbhai G Patel
(74) *Attorney, Agent, or Firm* — Sheppard Mullin Richter & Hampton LLP (57) ABSTRACT

A vehicle controller includes: a control box having a first outer surface and a second outer surface disposed opposite to each other in a thickness direction of the control box, the first outer surface including a control cooling water channel, which includes an Insulated Gate Bipolar Transistor (IGBT) cooling layer, a power supply cooling layer, and a transition section, and the IGBT cooling layer and the power supply cooling layer stacked in the thickness direction of the control box and communicated to each other by using the transition section; an IGBT module mounted on the first outer surface and extending into the IGBT cooling layer and being cooled by coolant in the IGBT cooling layer; and a power supply module mounted on the second outer surface and the power supply module adjacent to the power supply cooling layer and cooled by coolant in the power supply cooling layer.

16 Claims, 8 Drawing Sheets

(51) Int. Cl.
*H05K 5/03* (2006.01)
*H05K 9/00* (2006.01)

(56) References Cited

U.S. PATENT DOCUMENTS

| | | |
|---|---|---|
| 2013/0146254 A1 | 6/2013 | Jeon et al. |
| 2014/0313806 A1 | 10/2014 | Shinohara et al. |
| 2015/0246619 A1* | 9/2015 | Nagao .................... B60L 53/24 307/10.1 |
| 2015/0334875 A1 | 11/2015 | Topolewski et al. |

FOREIGN PATENT DOCUMENTS

| | | | |
|---|---|---|---|
| CN | 210579859 U | | 5/2020 |
| CN | 211880874 U | * | 11/2020 |
| EP | 2101402 A2 | | 9/2009 |
| EP | 1919069 B1 | | 8/2017 |
| WO | 2016186102 A1 | | 11/2016 |
| WO | 2017092192 A1 | | 6/2017 |

\* cited by examiner

VEHICLE CONTROLLER AND VEHICLE HAVING SAME

CROSS-REFERENCE TO RELATED APPLICATIONS

This application is a Continuation Application of International Patent Application No. PCT/CN2022/084261, filed on Mar. 31, 2022, which is based on and claims priority to and benefits of Chinese Patent Application Serial No. 202110679816.1, filed on Jun. 18, 2021. The entire content of all of the above-referenced application is incorporated herein by reference.

FIELD

The present disclosure relates to the field of vehicle technologies, and more particularly, to a vehicle controller and a vehicle having same.

BACKGROUND

A vehicle controller in the related art generally includes a control box, an IGBT (Insulated Gate Bipolar Transistor) module, and a power supply module. The vehicle controller is configured to dissipate heat of the IGBT module and the power supply module by disposing a cooling water channel in the control box. However, due to an improper layout of the cooling water channel, a space of the cooling water channel is small, and a heat exchange area between a coolant and the IGBT module and the power supply module is small. Therefore, heat of the IGBT module and the power supply module cannot be effectively dissipated, and a heat dissipation effect is poor. In addition, the IGBT module is close to the power supply module, and electromagnetic compatibility is poor.

SUMMARY

The present disclosure resolves at least one of the technical problems in the related art. The present disclosure provides a vehicle controller and a vehicle having same. Double layers of control cooling water channels of the vehicle controller are disposed, which have advantages such as a large water channel space, a high heat dissipation efficiency, and a good shielding effect.

The present disclosure further provides a vehicle having the vehicle controller.

A vehicle controller is provided according to an embodiment of the first aspect of the present disclosure. The vehicle controller includes: a control box, the control box having a first outer surface and a second outer surface that are disposed opposite to each other in a thickness direction of the control box, the first outer surface including a control cooling water channel, the control cooling water channel including an IGBT cooling layer, a power supply cooling layer, and a transition section, and the IGBT cooling layer and the power supply cooling layer being stacked in the thickness direction of the control box and communicated via the transition section; an Insulated Gate Bipolar Transistor (IGBT) module, the IGBT module being mounted on the first outer surface, and the IGBT module extending into the IGBT cooling layer and being cooled by coolant in the IGBT cooling layer; and a power supply module, the power supply module being mounted on the second outer surface, and the power supply module being adjacent to the power supply cooling layer and cooled by coolant in the power supply cooling layer.

According to some embodiments of the present disclosure, the control box includes: a box body, the power supply cooling layer being disposed in the box body, and the power supply module being mounted in the box body; and a water channel cover plate, the water channel cover plate being mounted in the box body and covering the power supply cooling layer, the water channel cover plate and the box body defining the transition section, the IGBT cooling layer being disposed in the water channel cover plate, and the IGBT module being mounted in the water channel cover plate; an application well is disposed on the water channel cover plate, the application well is in communication with the IGBT cooling layer, and the IGBT module extends into the IGBT cooling layer via the application well; and a mounting surface is disposed on a surface of the water channel cover plate facing away from the box body, the mounting surface surrounds the application well, and the IGBT module is mounted on the mounting surface.

According to some embodiments of the present disclosure, a sealing groove around the application well is disposed on the mounting surface, a sealing ring is disposed in the sealing groove, and the sealing ring seals a gap between the mounting surface and the IGBT module.

According to some embodiments of the present disclosure, the water channel cover plate includes: a cover portion, the cover portion being mounted in the box body and covering the power supply cooling layer, and the cover portion and the box body defining the transition section; and a plug-in portion, the plug-in portion being connected to a surface of the cover portion facing away from the box body, the IGBT module being mounted on a surface of the plug-in portion facing away from the cover portion, and the plug-in portion and the cover portion defining the IGBT cooling layer.

According to some embodiments of the present disclosure, the control cooling water channel further includes a water inlet section, and the water inlet section is connected to an end of the IGBT cooling layer away from the transition section; the control box is connected to a water inlet pipe, and the water inlet pipe is in communication with the water inlet section; and the water inlet section includes a first section and a second section, the first section is in communication with the water inlet pipe, and two ends of the second section are respectively connected to the first section and the IGBT cooling layer; where the first section is offset from the IGBT cooling layer to the second outer surface in the thickness direction of the control box.

According to some embodiments of the present disclosure, the control box includes: a box body, the power supply cooling layer being disposed in the box body, and the power supply module being mounted in the box body; and a water channel cover plate, the water channel cover plate being mounted in the box body and covering the power supply cooling layer, the water channel cover plate and the box body defining the transition section, the IGBT cooling layer being disposed in the water channel cover plate, and the IGBT module being mounted in the water channel cover plate; where a first portion of the second section is disposed on the box body and a second portion of the second section is disposed on the water channel cover plate.

According to some embodiments of the present disclosure, the second outer surface includes multiple shielding cavities, and each of the shielding cavities shares at least one side wall with a water channel of the power supply cooling layer.

According to some embodiments of the present disclosure, the transition section includes a third section and a fourth section, the third section is in communication with the power supply cooling layer, and two ends of the fourth section are respectively in communication with the third section and the IGBT cooling layer; where the third section is offset from the IGBT cooling layer to the second outer surface in the thickness direction of the control box.

According to some embodiments of the present disclosure, the control box includes: a box body, the power supply cooling layer being disposed in the box body, and the power supply module being mounted in the box body; and a water channel cover plate, the water channel cover plate being mounted in the box body and covering the power supply cooling layer, the water channel cover plate and the box body defining the transition section, the IGBT cooling layer being disposed in the water channel cover plate, and the IGBT module being mounted in the water channel cover plate; where the fourth section is disposed on the water channel cover plate, and the third section is disposed on the box body and covered by the water channel cover plate; and a depth of the third section is less than a depth of the power supply cooling layer.

According to some embodiments of the present disclosure, the power supply cooling layer includes a fifth section, a sixth section, a seventh section, and a drain section that are connected, the fifth section is connected to the transition section, the fifth section and the seventh section are parallel to each other, the sixth section is connected between the fifth section and the seventh section and is disposed obliquely to the fifth section and the seventh section, a first end of the drain section is connected to the seventh section, and a drain hole is disposed on a second end of the drain section; and a water outlet section and a water outlet pipe are disposed in the box body, and the drain hole is in communication with the water outlet pipe via the water outlet section.

According to some embodiments of the present disclosure, a first shielding rib and a second shielding rib are disposed on the second outer surface, the first shielding rib is located on a side of the fifth section facing away from the seventh section, and the second shielding rib is located on a side of the seventh section facing away from the fifth section; and the first shielding rib and the fifth section form a first shielding cavity, the second shielding rib and the seventh section form a second shielding cavity, the power supply module includes multiple MOS transistors, and the MOS transistors are located in the first shielding cavity and the second shielding cavity.

According to some embodiments of the present disclosure, the fifth section, the sixth section, and the seventh section form a third shielding cavity, the power supply module further includes a transformer and a transformer inductor, and the transformer and the transformer inductor are located in the third shielding cavity; and the MOS transistor, the transformer, and the transformer inductor are disposed on a circuit board, and the circuit board covers the first shielding cavity, the second shielding cavity, and the third shielding cavity.

An embodiment of a second aspect of the present disclosure provides a vehicle, including: the vehicle controller according to the embodiment of the first aspect of the present disclosure; a power box, the power box being mounted in the vehicle controller and including a motor cooling water channel, and the motor cooling water channel being in communication with the control cooling water channel; and a motor and a transmission, the motor and the transmission being transmission-connected and mounted in the power box, the motor being connected to the IGBT module, and the motor and the transmission being cooled by coolant in the motor cooling water channel.

The vehicle according to the embodiment of the second aspect of the present disclosure has advantages such as a large water channel space, high cooling efficiency, and a good shielding effect by having the vehicle controller according to the embodiment of the first aspect of the present disclosure.

The additional aspects and advantages of the present disclosure will be provided in the following description, some of which will become apparent from the following description or may be learned from practices of the present disclosure.

BRIEF DESCRIPTION OF THE DRAWINGS

The foregoing and/or additional aspects and advantages of the present disclosure will become apparent and comprehensible from the following descriptions of the embodiments with reference to the accompanying drawings, where.

DETAILED DESCRIPTION

The embodiments of the present disclosure are described below in detail. Examples of the embodiments are shown in the accompanying drawings, and same or similar reference signs in all the accompanying drawings indicate same or similar components or components having same or similar functions. The embodiments described below with reference to the accompanying drawings are exemplary, and are merely to explain the present disclosure and cannot be construed as a limitation to the present disclosure.

In the description of the present disclosure, it should be understood that orientation or position relationships indicated by the terms such as "center", "longitudinal", "transverse", "length", "width", "thickness", "on", "below", "front", "back", "left", "right", "vertical", "horizontal", "top", "bottom", "inside", "outside", "clockwise", "anticlockwise", "axial", "radial", and "circumferential" are based on orientation or position relationships shown in the accompanying drawings, and are used only for ease and brevity of illustration and description, rather than indicating or implying that the mentioned apparatus or component must have a particular orientation or must be constructed and operated in a particular orientation. Therefore, such terms should not be construed as limiting of the present disclosure.

In the description of the present disclosure, "first feature" and "second feature" may include one or more of the features.

In the description of the present disclosure, "a number of" means two or more than two, and "several" means one or more.

A vehicle controller 1 according to an embodiment of the present disclosure is described below with reference to the accompanying drawings.

As shown in FIG. 1 to FIG. 8, the vehicle controller 1 according to an embodiment of the present disclosure includes a control box 100, an Insulated Gate Bipolar Transistor (IGBT) module 200, and a power supply module 300.

The control box 100 has a first outer surface 110 and a second outer surface 120 that are disposed opposite to each other in a thickness direction of the control box, the first outer surface 110 is provided with a control cooling water channel 111, the control cooling water channel 111 includes an IGBT cooling layer 112, a power supply cooling layer 113, and a transition section 114, and the IGBT cooling layer 112 and the power supply cooling layer 113 are stacked in the thickness direction of the control box 100 and communicated via the transition section 114. The IGBT module 200 is mounted on the first outer surface 110, and the IGBT module 200 extends into the IGBT cooling layer 112 and is cooled by coolant in the IGBT cooling layer 112. The power supply module 300 is mounted on the second outer surface 120, and the power supply module 300 is adjacent to the power supply cooling layer 113 and is cooled by coolant in the power supply cooling layer 113.

For example, the control cooling water channel 111 may be provided with coolant, and the coolant can flow in the IGBT cooling layer 112, the transition section 114, and the power supply cooling layer 113.

According to the vehicle controller 1 of the embodiment of the present disclosure, the control box 100 has the first outer surface 110 and the second outer surface 120 disposed opposite to each other in the thickness direction of the control box 100, the first outer surface 110 and the second outer surface 120 are disposed at intervals, and the control box 100 may separately construct, in each of the first outer surface 110 and the second outer surface 120, a space that can accommodate a component, where the first outer surface 110 is provided with the control cooling water channel 111, and the control cooling water channel 111 is separated from the second outer surface 120, that is, the coolant in the control cooling water channel 111 does not flow out from the second outer surface 120. Therefore, a component that cannot be directly in contact with the coolant may be disposed on the second outer surface 120. In this way, when the coolant is not directly in contact with the component in the second outer surface 120, the coolant can dissipate heat on the component in the second outer surface 120.

In addition, the control cooling water channel 111 includes the IGBT cooling layer 112, the power supply cooling layer 113, and the transition section 114, and the IGBT cooling layer 112 and the power supply cooling layer 113 are stacked in the thickness direction of the control box 100 and communicated via the transition section 114. The transition section 114 may extend in the thickness direction of the control box 100, and a volume of the transition section 114 may be set to relatively small. The transition section 114 is mainly configured to communicate the IGBT cooling layer 112 with the power supply cooling layer 113, so that the coolant can circulate in the IGBT cooling layer 112 and the power supply cooling layer 113.

The IGBT cooling layer 112 and the power supply cooling layer 113 are stacked, so that a space and a flow length of the control cooling water channel 111 can be increased, the control cooling water channel 111 can dissipate heat on more components, a heat exchange area of the control cooling water channel 111 and a component that needs to be dissipated in the control box 100 can be greater, and a heat dissipation effect is better.

In addition, the IGBT module 200 is mounted on the first outer surface 110, and the IGBT module 200 extends into the IGBT cooling layer 112 and is cooled by the coolant in the IGBT cooling layer 112. In this way, the IGBT module 200 can be soaked by the coolant in the IGBT cooling layer 112, so that a heat exchange area between the IGBT module 200 and the coolant is large, thereby increasing a heat dissipation rate of the IGBT module 200. The control box 100 may adapt to an IGBT module 200 with higher power density, so as to increase power of the IGBT module 200.

In addition, the power supply module 300 is mounted on the second outer surface 120, and the power supply module 300 is adjacent to the power supply cooling layer 113 and is cooled by coolant in the power supply cooling layer 113. The power supply module 300 is separated from the power supply cooling layer 113. After the coolant in the IGBT cooling layer 112 flows into the power supply cooling layer 113 through the transition section 114 after cooling the IGBT module 200, the coolant in the power supply cooling layer 113 can cool and dissipate heat of the power supply module 300. In this way, the control cooling water channel 111 can dissipate heat of the IGBT cooling layer 112 and the power supply module 300 at the same time, and utilization of the control cooling water channel 111 is high. In addition, a distance between the IGBT module 200 and the power supply module 300 is farther, so that electromagnetic interference between the IGBT module 200 and the power supply module 300 can be reduced, and a shielding effect is better.

It can be learned from the foregoing that the IGBT cooling layer 112 and the power supply cooling layer 113 are stacked in the thickness direction of the control box 100. Therefore, the IGBT cooling layer 112 can have a larger cross-sectional area at a layer at which the IGBT cooling layer 112 is located, so as to fully dissipate heat of the IGBT module 200. In addition, the power supply cooling layer 113 can have a larger cross-sectional area at a layer at which the power supply cooling layer 113 is located, so as to fully dissipate heat of the power supply module 300, so as to greatly optimize working performance of the vehicle controller 1.

In this way, double separated layers of control cooling water channels 111 of the vehicle controller 1 according to this embodiment of the present disclosure are disposed, which has advantages such as a large water channel space, high heat dissipation efficiency, and a good shielding effect.

According to some embodiments of the present disclosure, as shown in FIG. 2 to FIG. 6, the control box 100 includes a box body 130 and a water channel cover plate 140.

The power supply cooling layer 113 is formed/disposed in the box body 130, and the power supply module 300 is mounted in the box body 130. The water channel cover plate 140 is mounted in the box body 130 and covers the power supply cooling layer 113. For example, the water channel cover plate 140 may be located on a side of the first outer surface 110 facing away from the second outer surface 120. The water channel cover plate 140 and the box body 130 jointly define the transition section 114. The transition section 114 is configured to communicate the IGBT cooling layer 112 with the power supply cooling layer 113.

Because the control box 100 is disposed as the box body 130 and the water channel cover plate 140 in a separate manner, the power supply cooling layer 113 and the IGBT cooling layer 112 may be processed separately, and the power supply cooling layer 113 is opened toward a side of the water channel cover plate 140, that is, the power supply cooling layer 113 penetrates through the first outer surface 110, so that the power supply cooling layer 113 can be processed effectively. After the power supply cooling layer 113 is formed, the water channel cover plate 140 is mounted in the box body 130 to seal the power supply cooling layer 113. In this way, the power supply cooling layer 113 is sealed, and processing difficulty of the power supply cooling layer 113 can be reduced.

In addition, the IGBT cooling layer 112 is formed on the water channel cover plate 140, and the IGBT module 200 is mounted on the water channel cover plate 140. For example, the IGBT cooling layer 112 may be formed on a side of the water channel cover plate 140 facing away from the power supply cooling layer 113, and the IGBT module 200 may be located on a side of the water channel cover plate 140 facing away from the box body 130. In this way, a distance between the IGBT module 200 and the power supply module 300 is farther, which can reduce electromagnetic interference between the IGBT module 200 and the power supply module 300.

Figure 2:
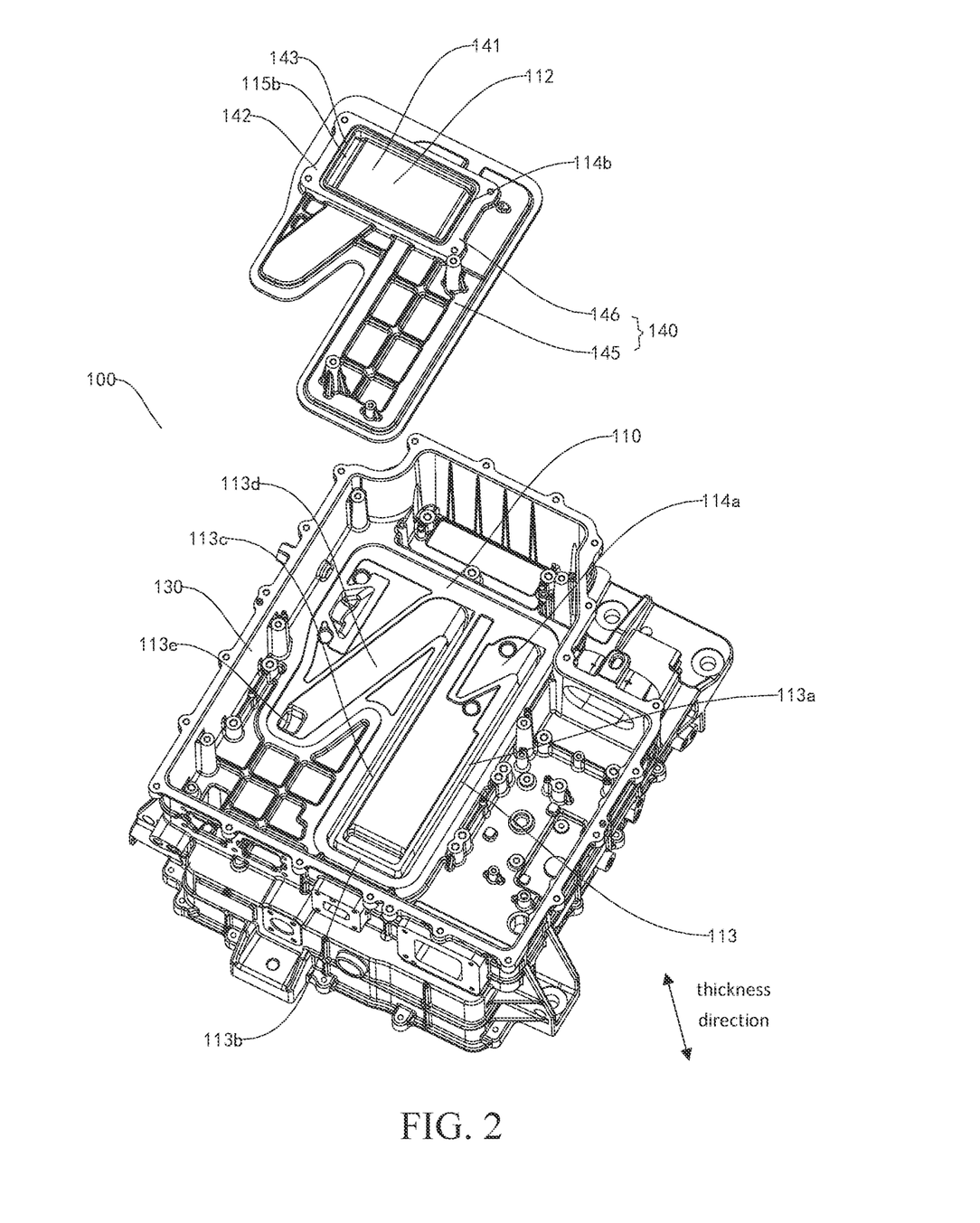
FIG. 2 is an explosive view of a box body and a water channel cover plate of a vehicle controller according to an embodiment of the present disclosure.

In some embodiments of the present disclosure, as shown in FIG. 2, the water channel cover plate 140 is provided with an application well 141. The application well 141 may be located on a side of the water channel cover plate 140 facing away from the box body 130, and a side of the application well 141 facing away from the box body 130 is open. A shape of the application well 141 may adapt to a shape of one end of the IGBT module 200 facing the water channel cover plate 140, the application well 141 is in communication with the IGBT cooling layer 112, and the IGBT module 200 extends into the IGBT cooling layer 112 via the application well 141.

By disposing the application well 141, the IGBT module 200 can be coated with the coolant in the IGBT cooling layer 112 along a circumferential direction of the IGBT module 200, so that a contact area between the coolant in the IGBT cooling layer 112 and the IGBT module 200 is increased, and a heat dissipation effect is good.

In some embodiments of the present disclosure, as shown in FIG. 2, a mounting surface 142 is disposed on a surface of the water channel cover plate 140 facing away from the box body 130, the mounting surface 142 surrounds the application well 141, and the IGBT module 200 is mounted on the mounting surface 142.

For example, an end of the IGBT module 200 facing away from the water channel cover plate 140 protrudes from the IGBT cooling layer 112 through the application well 141, and a cross-sectional area of the end is greater than a cross-sectional area of the application well 141. The end may cooperate with the mounting surface 142 by a threaded fastener (for example, a bolt). There may be multiple threaded fasteners, and the multiple threaded fasteners are disposed at intervals along a circumferential direction of the application well 141.

In this way, on the one hand, the IGBT module 200 and the mounting surface 142 may be fastened, so that a fixed connection between the IGBT module 200 and the water channel cover plate 140 is implemented. On the other hand, because a portion of the IGBT module 200 protrudes from the application well 141, a large area that can be held by a person is large, and it is convenient to disassemble and assemble the IGBT module 200.

Figure 4:
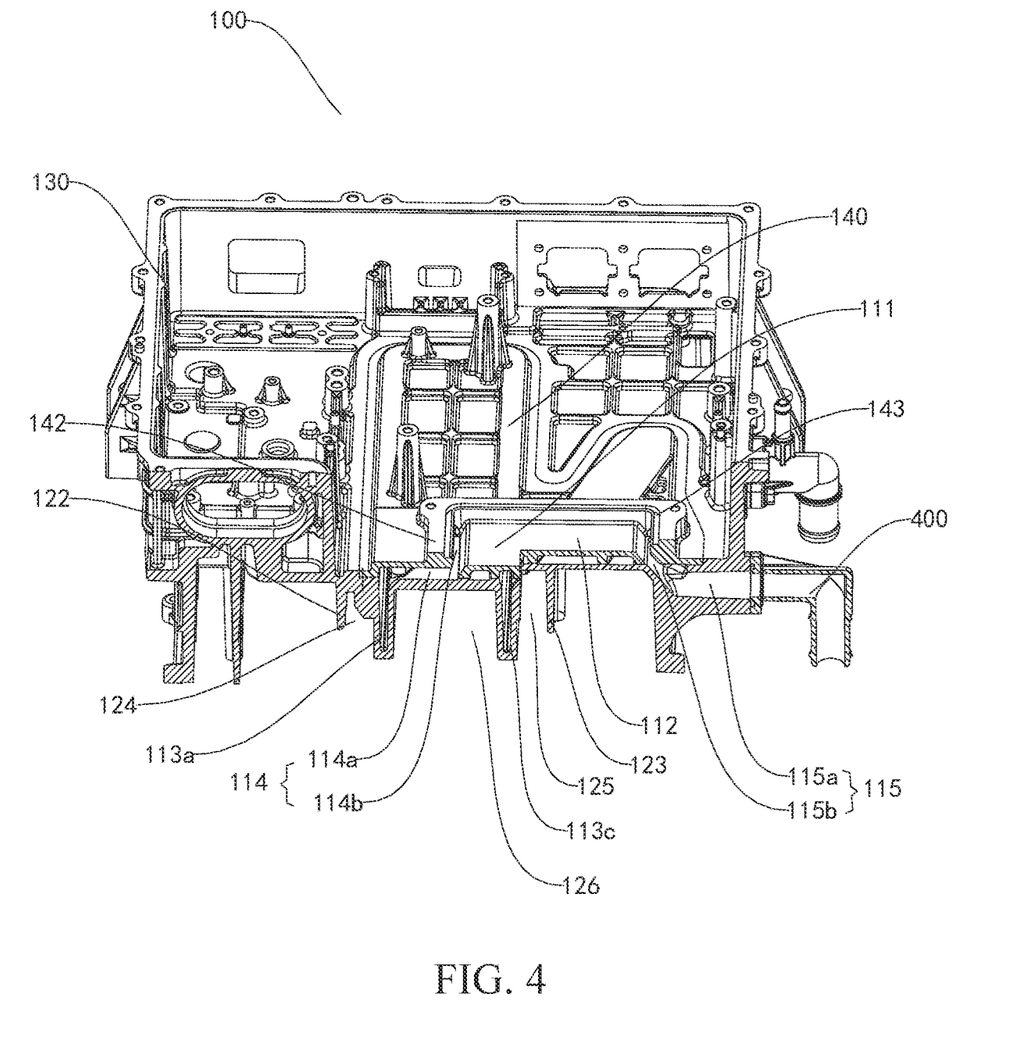
FIG. 4 is a cross-sectional view of a control box of a vehicle controller according to an embodiment of the present disclosure.

As shown in FIG. 2 and FIG. 4, a sealing groove 143 around the application well 141 is disposed on the mounting surface 142, a sealing ring 144 is disposed in the sealing groove 143, and the sealing ring 144 seals a gap between the mounting surface 142 and the IGBT module 200. That is, the sealing groove 143 is disposed on a side of the water channel cover plate 140 facing away from the box body 130, and the sealing ring 144 is mounted in the sealing groove 143. In addition, the sealing ring 144 may protrude from the mounting surface 142. After the IGBT module 200 is inserted into the application well 141, the IGBT module 200 and the mounting surface 142 compress the sealing ring 144 to elastically deform the sealing ring 144, so as to implement sealing between the mounting surface 142 and the IGBT module 200, thereby effectively preventing the coolant from flowing out of the application well 141, thereby ensuring higher sealing property, and ensuring reliability of the vehicle controller 1.

According to some embodiments of the present disclosure, as shown in FIG. 2, the water channel cover plate 140 includes a cover portion 145 and a plug-in portion 146.

The cover portion 145 is mounted in the box body 130 and covers the power supply cooling layer 113. The cover portion 145 and the box body 130 define the transition section 114. The coolant can flow within the power supply cooling layer 113 without overflowing, the transition section 114 is configured to communicate the IGBT cooling layer 112 with the power supply cooling layer 113, and the coolant can flow from the IGBT cooling layer 112 to the power supply cooling layer 113 through the transition section 114.

In addition, the plug-in portion 146 is connected to a surface of the cover portion 145 facing away from the box body 130, the IGBT module 200 is mounted on a surface of the plug-in portion 146 facing away from the cover portion 145, and the plug-in portion 146 and the cover portion 145 define the IGBT cooling layer 112.

In an embodiment, the plug-in portion 146 protrudes from a side of the cover portion 145 facing away from the box body 130, the cover portion 145 is configured to be a bottom wall of the IGBT cooling layer 112, and the plug-in portion 146 is configured to be a side wall of the IGBT cooling layer 112. In this way, not only the IGBT module 200 is effectively mounted, but also the IGBT cooling layer 112 and the power supply cooling layer 113 are disposed at intervals in the thickness direction of the box body 130, a space of the IGBT cooling layer 112 is larger, and the coolant can fully cool the IGBT module 200.

According to some embodiments of the present disclosure, the water channel cover plate 140 and the box body 130 are welded together, for example, the water channel cover plate 140 and the box body 130 are connected by friction welding. In this way, the connection between the water channel cover plate 140 and the box body 130 is more reliable, so that relative displacement of the water channel cover plate 140 to the power supply cooling layer 113 can be avoided when the vehicle is shaking or traveling. The water channel cover plate 140 has a better sealing effect on the power supply cooling layer 113, thereby ensuring overall sealing of the control cooling water channel 111, and the coolant can circulate normally in the control cooling water channel 111.

Figure 5:
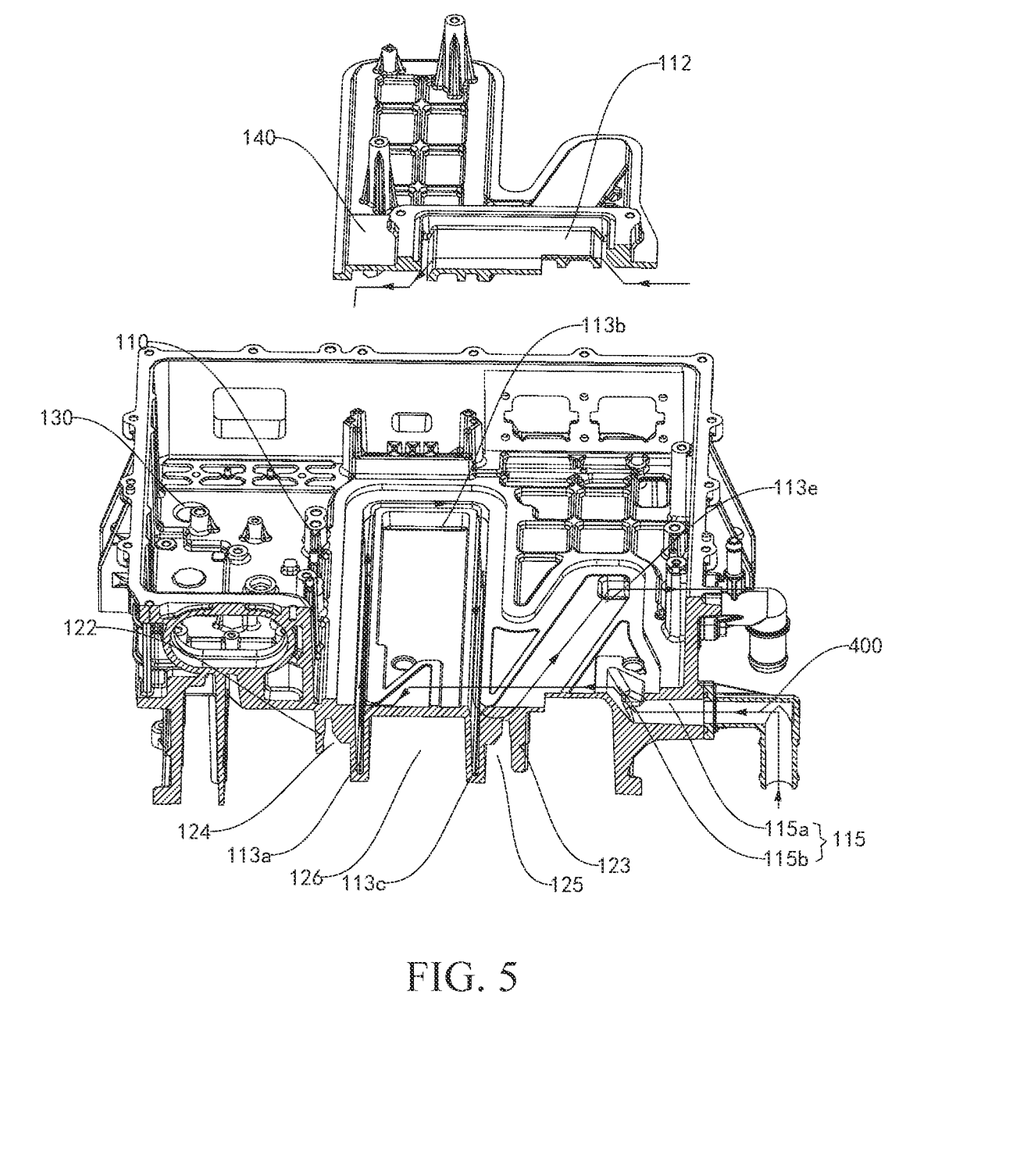
FIG. 5 is a cross-sectional view after explosion of a control box of a vehicle controller according to an embodiment of the present disclosure, a direction indicated by an arrow being a schematic diagram of coolant flow.
Figure 6:
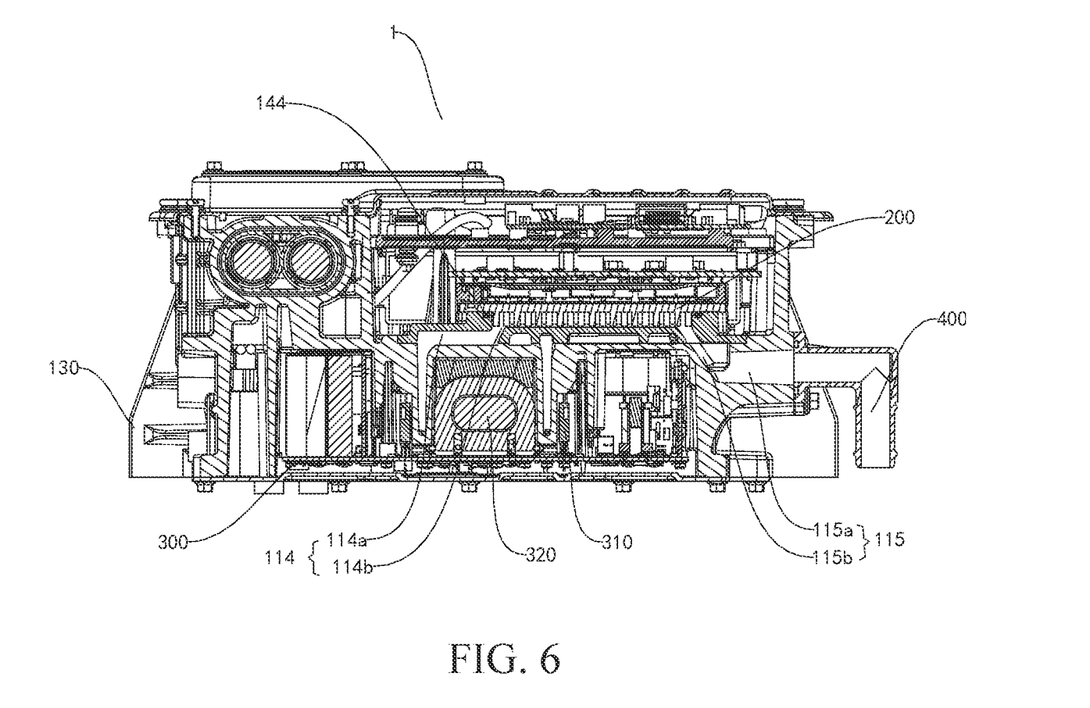
FIG. 6 is a cross-sectional view of a vehicle controller according to an embodiment of the present disclosure.

According to some embodiments of the present disclosure, as shown in FIG. 4 to FIG. 6, the control cooling water channel 111 further includes a water inlet section 115 connected to one end of the IGBT cooling layer 112 away from the transition section 114, that is, the water inlet section 115 and the transition section 114 are located on opposite sides of the IGBT cooling layer 112, so that after the coolant enters the IGBT cooling layer 112, when the coolant flows from the water inlet section 115 to the transition section 114, the coolant can be fully diffused in the IGBT cooling layer 112, so that the IGBT module 200 can be sufficiently cooled and heat dissipation efficiency can be increased.

In addition, the control box 100 is connected to a water inlet pipe 400, and the water inlet pipe 400 is connected to the water inlet section 115. The coolant is input to the IGBT cooling layer 112 through the water inlet section 115 from the water inlet pipe 400. The water inlet pipe 400 may be disposed on a side surface of the box body 130 that is circumferentially adjacent to the water inlet section 115, so that the water inlet pipe 400 is connected to the water inlet section 115 to input the coolant.

In some embodiments of the present disclosure, as shown in FIG. 4 to FIG. 6, the water inlet section 115 includes a first section 115*a* and a second section 115*b*. The first section 115*a* is in communication with the water inlet pipe 400, and two ends of the second section 115*b* are respectively connected to the first section 115*a* and the IGBT cooling layer 112. In this way, communication between the water inlet pipe 400 and the IGBT cooling layer 112 can be implemented, and the coolant can be delivered to the IGBT cooling layer 112 sequentially through the first section 115*a* and the second section 115*b* via the water inlet pipe 400.

The first section 115*a* is offset from the IGBT cooling layer 112 to the second outer surface 120 in the thickness direction of the control box 100, that is, the first section 115*a* and the IGBT cooling layer 112 are parallel to each other. In this case, the water inlet pipe 400 is located between the first outer surface 110 and the second outer surface 120, which helps reduce the volume of the box body 130.

For example, the second section 115*b* may be perpendicular to the IGBT cooling layer 112 and the first section 115*a* in the thickness direction of the control box 100. In an embodiment, the second section 115*b* is obliquely disposed relative to the thickness direction of the control box 100, an angle between the first section 115*a* and the second section 115*b* is not a right angle, an angle between the second section 115*b* and the IGBT cooling layer 112 is not a right angle, and orthographic projections of the first section 115*a* and the IGBT cooling layer 112 toward the first outer surface 110 do not overlap. In this way, on the one hand, the water inlet section 115 can be closer to the power supply module 300, and the coolant in the water inlet section 115 can dissipate heat of the power supply module 300, so that the coolant has a better heat dissipation effect. On the other hand, there is no right angle or sharp angle between the water inlet section 115 and the IGBT cooling layer 112, so that the coolant flows more smoothly and gently.

According to some embodiments of the present disclosure, as shown in FIG. 4 to FIG. 6, the control box 100 includes a box body 130 and a water channel cover plate 140. The power supply cooling layer 113 is formed in the box body 130, and the power supply module 300 is mounted in the box body 130. The water channel cover plate 140 is mounted in the box body 130 and covers the power supply cooling layer 113, the water channel cover plate 140 and the box body 130 jointly define the transition section 114, the IGBT cooling layer 112 is formed in the water channel cover plate 140, and the IGBT module 200 is mounted in the water channel cover plate 140.

Because the control box 100 is disposed as the box body 130 and the water channel cover plate 140 in a separate manner, the power supply cooling layer 113 and the IGBT cooling layer 112 may be processed separately, and the power supply cooling layer 113 is opened toward a side of the water channel cover plate 140, that is, the power supply cooling layer 113 penetrates through the first outer surface 110, so that the power supply cooling layer 113 can be processed effectively. After the power supply cooling layer 113 is formed, the water channel cover plate 140 is mounted in the box body 130 to seal the power supply cooling layer 113. In this way, the power supply cooling layer 113 is sealed, and processing difficulty of the power supply cooling layer 113 can be reduced.

A portion (e.g., a first portion) of the second section 115*b* is formed on the box body 130 and the other portion (e.g., a second portion) is formed on the water channel cover plate 140. The second section 115*b* is disposed in the box body 130 and the water channel cover plate 140, and an angle between the portion of the second section 115*b* formed in the box body 130 and the first outer surface 110 may be the same as an angle between the portion of the second section 115*b* formed on the water channel cover plate 140 and the first outer surface 110. When the water channel cover plate 140 is mounted in the box body 130, the two portions of the second section 115*b* can be better matched together, thereby ensuring that the water inlet section 115 is communicated, so that the coolant flows smoothly.

Figure 3:
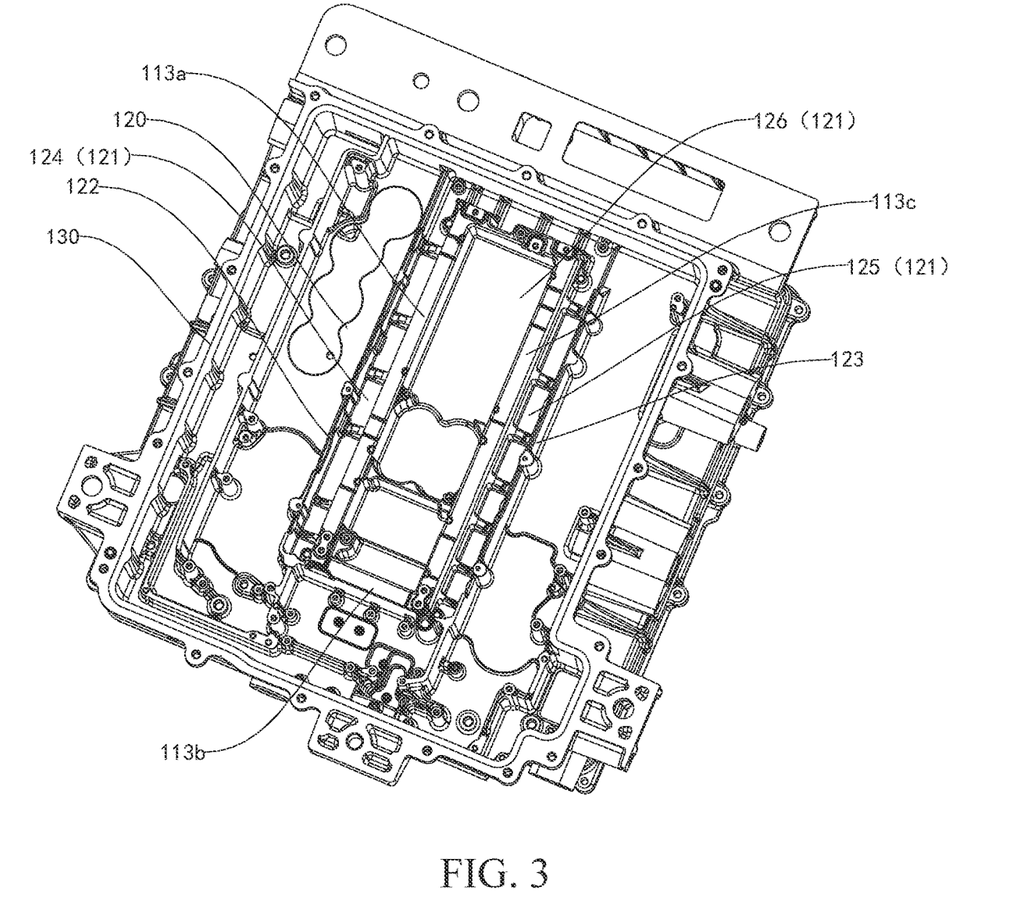
FIG. 3 is a structural schematic diagram of a box body of a vehicle controller according to an embodiment of the present disclosure.

According to some embodiments of the present disclosure, as shown in FIG. 3, the second outer surface 120 is configured with multiple shielding cavities 121, and the multiple shielding cavities 121 one-to-one receive multiple power modules of the power supply module 300. In this way, mutual interference between the multiple power modules can be prevented, interference to another element from the multiple power modules can be avoided, and an electro magnetic compatibility (Electro Magnetic Compatibility, EMC) effect can be improved.

In addition, water channels of each shielding cavity 121 and the power supply cooling layer 113 share at least one side wall. For example, one shielding cavity 121 may be formed entirely by a side wall of a water channel of the power supply cooling layer 113, or one side wall of one shielding cavity 121 is a side wall of a water channel of the power supply cooling layer 113. In this way, it can be ensured that the power supply cooling layer 113 can cool and dissipate heat of an element in each shielding cavity 121, and each shielding cavity 121 has a fastening function, a shielding function, and a cooling and heat dissipation function.

According to some embodiments of the present disclosure, as shown in FIG. 4 and FIG. 6, the transition section 114 includes a third section 114*a* and a fourth section 114*b*. The third section 114*a* is in communication with the power supply cooling layer 113, and two ends of the fourth section 114*b* are respectively in communication with the third section 114*a* and the IGBT cooling layer 112. In this way, communication between the IGBT cooling layer 112 and the power supply cooling layer 113 can be implemented, and the coolant of the IGBT cooling layer 112 can sequentially flow from the fourth section 114b and the third section 114a to the power supply cooling layer 113.

The third section 114a is offset from the IGBT cooling layer 112 to the second outer surface 120 in the thickness direction of the control box 100, that is, the third section 114a may be parallel to the IGBT cooling layer 112. For example, the fourth section 114b is connected to a bottom of the IGBT cooling layer 112, and gradually becomes away from the IGBT cooling layer 112 while the fourth section 114b is away from the first outer surface 110. In this way, the transition section 114 is closer to the power supply module 300, that is, a distance between the power supply cooling layer 113 and the power supply module 300 is closer, which facilitates heat dissipation of the power supply module 300 by the power supply cooling layer 113. In addition, there is a height difference between the third section 114a and the IGBT cooling layer 112, and the coolant in the IGBT cooling layer 112 flows more smoothly toward the third section 114a.

In an embodiment, an angle between the fourth section 114b and the third section 114a is not a right angle, an angle between the fourth section 114b and the IGBT cooling layer 112 is not a right angle, and orthographic projections of the third section 114a and the IGBT cooling layer 112 toward the first outer surface 110 do not overlap, so that the coolant flows more smoothly.

In some embodiments of the present disclosure, as shown in FIG. 4 and FIG. 6, the control box 100 includes a box body 130 and a water channel cover plate 140. The power supply cooling layer 113 is formed in the box body 130, and the power supply module 300 is mounted in the box body 130. The water channel cover plate 140 is mounted in the box body 130 and covers the power supply cooling layer 113, the water channel cover plate 140 and the box body 130 jointly define the transition section 114, the IGBT cooling layer 112 is formed in the water channel cover plate 140, and the IGBT module 200 is mounted in the water channel cover plate 140.

Because the control box 100 is disposed as the box body 130 and the water channel cover plate 140 in a separate manner, the power supply cooling layer 113 and the IGBT cooling layer 112 may be processed separately, and the power supply cooling layer 113 is opened toward a side of the water channel cover plate 140, that is, the power supply cooling layer 113 penetrates through the first outer surface 110, so that the power supply cooling layer 113 can be processed effectively. After the power supply cooling layer 113 is formed, the water channel cover plate 140 is mounted in the box body 130 to seal the power supply cooling layer 113. In this way, the power supply cooling layer 113 is sealed, and processing difficulty of the power supply cooling layer 113 can be reduced.

The fourth section 114b is formed in the water channel cover plate 140, and the third section 114a is formed in the box body 130 and is covered by the water channel cover plate 140. The water channel cover plate 140 covers the third section 114a, so that the coolant can be prevented from overflowing from the transition section 114 to the IGBT cooling layer. After the water channel cover plate 140 is mounted in the box body 130, the third section 114a and the fourth section 114b are communicated. The coolant sequentially flows into the fourth section 114b and the third section 114a from the IGBT cooling layer 112, and then flows into the power supply cooling layer 113, so as to dissipate heat of the power supply module 300. In addition, a cross-sectional area of the third section 114a may be set to be relatively large, so that a flow speed of the coolant can be slowed down, and the coolant fully dissipates heat of the power supply module 300.

In an embodiment, as shown in FIG. 2 and FIG. 6, a depth of the third section 114a is less than a depth of the power supply cooling layer 113.

For example, the power supply cooling layer 113 is formed in a recess of the first outer surface 110 that is recessed toward the second outer surface 120, and a depth direction of the power supply cooling layer 113 is parallel to the thickness direction of the box body 130. In addition, a bottom wall of the third section 114a may be a bottom wall of at least one shielding cavity 121. By reducing the depth of the third section 114a, a volume of the at least one shielding cavity 121 is increased, and space utilization is improved. In addition, in the thickness direction of the box body 130, the third section 114a is located between the bottom wall of the power supply cooling layer 113 and the IGBT cooling layer 112, and the third section 114a separately forms a height difference from the power supply cooling layer 113 and the IGBT cooling layer 112. Therefore, the third section 114a can play a buffer role, and the coolant can flow more smoothly to the power supply cooling layer 113 through the transition section 114 from the IGBT cooling layer 112, so that the coolant can fully play a cooling and heat dissipation function, and the coolant can be prevented from splashing.

Figure 7:
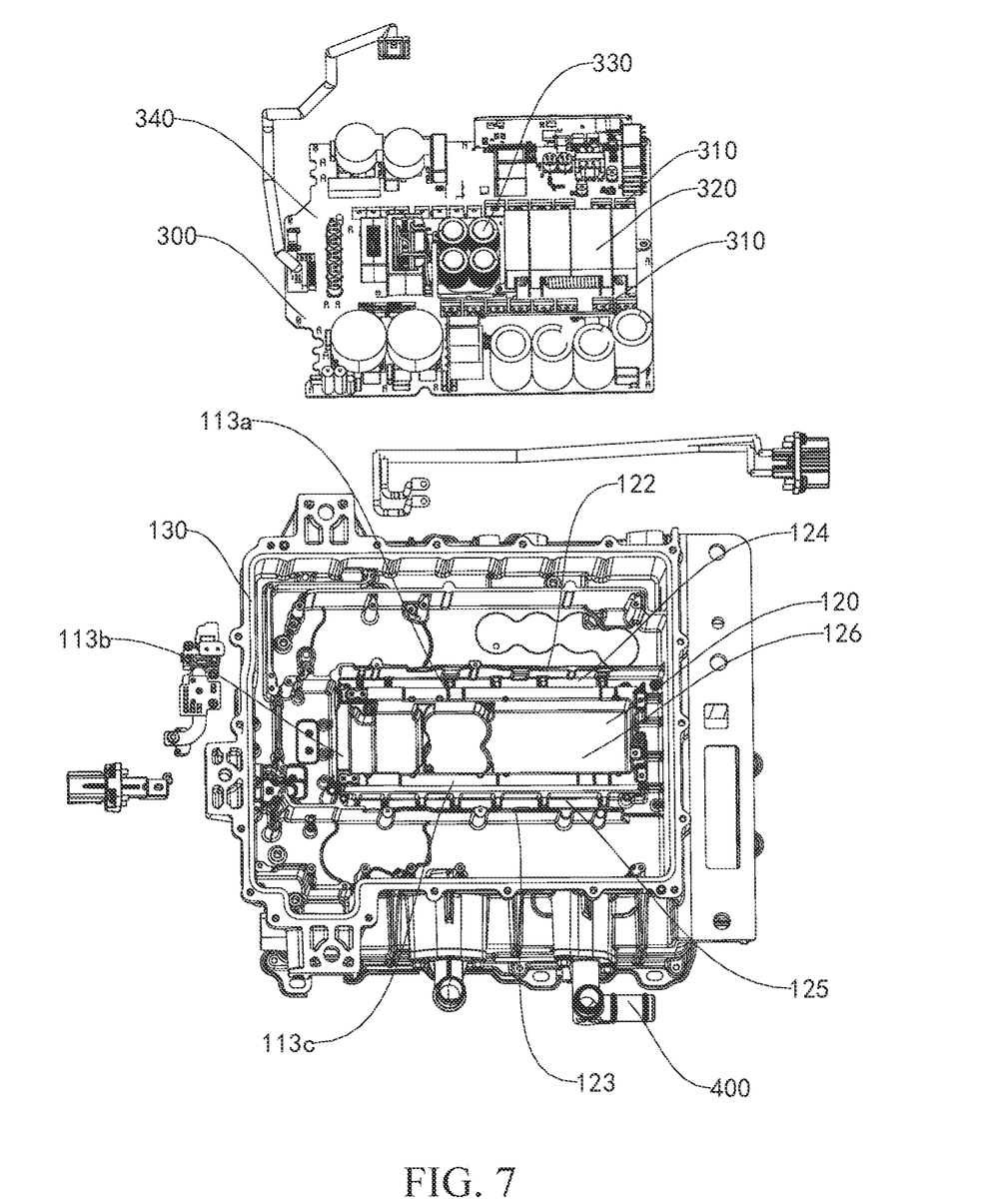
FIG. 7 is an explosive view of a box body and a power supply module of a vehicle controller according to an embodiment of the present disclosure.

According to some embodiments of the present disclosure, as shown in FIG. 2, FIG. 3, and FIG. 7, the power supply cooling layer 113 includes a fifth section 113a, a sixth section 113b, a seventh section 113c, and a drain section 113d that are sequentially connected.

The fifth section 113a is connected to the transition section 114, the fifth section 113a and the seventh section 113c are parallel to each other, and the sixth section 113b is connected between the fifth section 113a and the seventh section 113c and is obliquely disposed relative to the fifth section 113a and the seventh section 113c. For example, the sixth section 113b is respectively perpendicular to the fifth section 113a and the seventh section 113c, that is, the fifth section 113a, the sixth section 113b, and the seventh section 113c may form a shape of "几".

By bending the power supply cooling layer 113 into multiple sections, a length of the power supply cooling layer 113 can be increased, and the power supply cooling layer 113 can dissipate heat of the power supply module 300 more sufficiently, so that a contact area between the power supply cooling layer 113 and the power supply module 300 is larger, and a heat dissipation effect is better.

In addition, one end (e.g., a first end) of the drain section 113d is connected to the seventh section 113c, and a drain hole 113e is disposed on the other end (e.g., a second end) of the drain section 113d. The coolant in the seventh section 113c may flow from the drain section 113d to the drain hole 113e. A depth of the drain section 113d may be less than a depth of the seventh section 113c, and a bottom wall of the drain section 113d may further stop the coolant, so as to reduce a flow rate of the coolant, so that the coolant flows in the power supply cooling layer 113 for a longer time, which is conducive to sufficient heat exchange between the coolant in the fifth section 113a, the sixth section 113b, and the seventh section 113c and the power supply module 300. Therefore, the coolant is more efficient to use, so that the coolant can effectively dissipate heat of the power supply module 300.

In addition, a water outlet section and a water outlet pipe 132 are disposed in the box body 130. The drain hole 113e is in communication with the water outlet pipe 132 via the water outlet section. The water outlet section is gradually away from the first outer surface 110 while being away from the drain section 113*d*. The water outlet pipe 132 may be located between the first outer surface 110 and the second outer surface 120. A structure of the box body 130 is more compact. After the coolant fully dissipates heat of the power supply module 300 in the power supply cooling layer 113, the coolant may successively flow through the drain hole 113*e*, the water outlet section, and the water outlet pipe 132 to be discharged out of the box body 130, to replace the coolant in the power supply cooling layer 113, and ensure a heat dissipation effect of the power supply cooling layer 113.

According to some embodiments of the present disclosure, as shown in FIG. 3 and FIG. 7, the second outer surface 120 is provided with a first shielding rib 122 and a second shielding rib 123.

The first shielding rib 122 is located on a side of the fifth section 113*a* facing away from the seventh section 113*c*, and the second shielding rib 123 is located on a side of the seventh section 113*c* facing away from the fifth section 113*a*. The first shielding rib 122 and the fifth section 113*a* enclose to form a first shielding cavity 124, the second shielding rib 123 and the seventh section 113*c* enclose to form a second shielding cavity 125, the power supply module 300 includes one or more MOS transistors 310, and the one or more MOS transistors 310 are located in the first shielding cavity 124 and the second shielding cavity 125.

For example, the first shielding rib 122 may include a first parallel section and multiple first sealing sections disposed at intervals. The first parallel section may be parallel to the fifth section 113*a*, and the first parallel section and the fifth section 113*a* are disposed at intervals. Each first sealing section is separately connected to the first parallel section and the fifth section 113*a*, and two adjacent first sealing sections, the first parallel section, and the fifth section 113*a* form the first shielding cavity 124. There may be multiple first shielding cavities 124. The second shielding rib 123 may include a second parallel section and multiple second closed sections disposed at intervals. The second parallel section may be parallel to the seventh section 113*c*, and the second parallel section and the seventh section 113*c* are disposed at intervals. Each second closed section is separately connected to the second parallel section and the seventh section 113*c*. Two second closed sections, the second parallel section, and the seventh section 113*c* form the second shielding cavity 125. There may be multiple second shielding cavities 125.

The power supply cooling layer 113 can dissipate heat of both the MOS transistor 310 in the first shielding cavity 124 and the MOS transistor 310 in the second shielding cavity 125. By disposing multiple shielding cavities 121, the power supply cooling layer 113 can not only fully dissipate heat of the MOS transistor 310, but also can accommodate the MOS transistor 310, to fasten relative locations of the MOS transistor 310 and the control box 100. In addition, the first shielding cavity 124 and the second shielding cavity 125 can shield the MOS transistor 310, to prevent the MOS transistor 310 from causing interference to another element (for example, a vehicle control board), thereby improving an EMC effect.

In some embodiments of the present disclosure, as shown in FIG. 3 and FIG. 7, the fifth section 113*a*, the sixth section 113*b*, and the seventh section 113*c* enclose to form a third shielding cavity 126, the third shielding cavity 126 is U-shaped, the power supply module 300 further includes a transformer 320 and a transformer inductor 330, and the transformer 320 and the transformer inductor 330 are located in the third shielding cavity 126. For example, the sixth section 113*b* may be disposed perpendicularly to the fifth section 113*a* and the seventh section 113*c*. In this way, a volume of the third shielding cavity 126 formed by the fifth section 113*a*, the sixth section 113*b*, and the seventh section 113*c* is increased to accommodate the transformer 320 and the transformer inductor 330, and to facilitate the mounting.

All of the fifth section 113*a*, the sixth section 113*b*, and the seventh section 113*c* can dissipate heat for the transformer 320 and the transformer inductor 330. A cooling effect of the power supply cooling layer 113 on an element in the third shielding cavity 126 is obvious, so that the transformer 320 and the transformer inductor 330 effectively dissipate heat, and the transformer 320 and the transformer inductor 330 can always be in a highly efficient working state. In addition, the third shielding cavity 126 can fasten relative positions of the transformer 320, the transformer inductor 330, and the control box 100, and the third shielding cavity 126 can shield the transformer 320 and the transformer inductor 330, so as to avoid interference from the transformer 320 and the transformer inductor 330 to another element (for example, a vehicle control board), and further improve an EMC effect.

In addition, the first shielding cavity 124, the second shielding cavity 125, and the third shielding cavity 126 are three mutually independent cavities. In this way, it can be ensured that power components in each cavity do not interfere with each other, a shielding effect is better, and EMC can be optimized again.

According to some embodiments of the present disclosure, as shown in FIG. 7, the MOS transistor 310, the transformer 320, and the transformer inductor 330 are integrated into a same circuit board 340, and the circuit board 340 covers the first shielding cavity 124, the second shielding cavity 125, and the third shielding cavity 126.

In an embodiment, the circuit board 340 is a whole. By integrating the foregoing components, a volume of the power supply module 300 can be reduced, and the MOS transistor 310, the transformer 320, and the transformer inductor 330 can be assembled and disassembled at the same time, thereby improving assembling efficiency of the power supply module 300. The MOS transistor 310, the transformer 320, and the transformer inductor 330 are mounted on a side of the circuit board 340 facing the second outer surface 120, and the circuit board 340 covers multiple shielding cavities 121, so that the MOS transistor 310, the transformer 320, and the transformer inductor 330 can be prevented from leaving corresponding shielding cavities 121.

A vehicle according to an embodiment of the present disclosure is described below with reference to the accompanying drawings.

Figure 1:
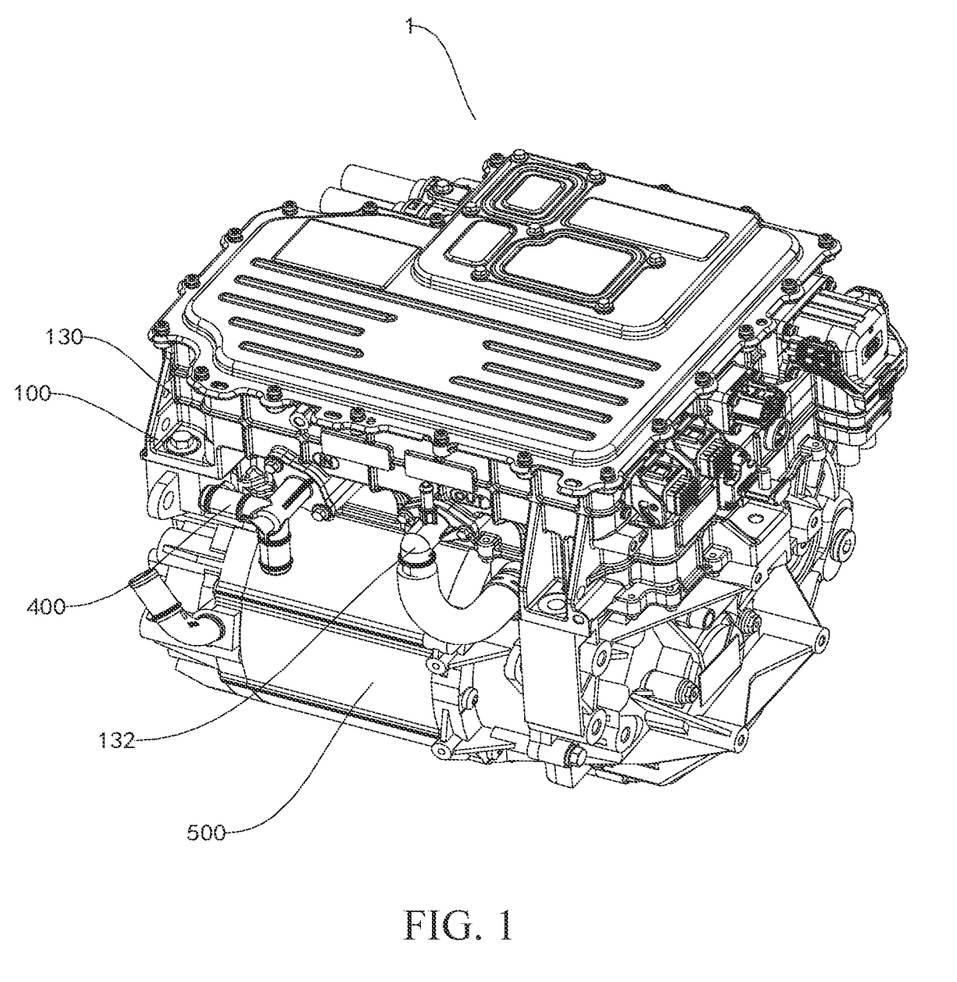
FIG. 1 is a structural schematic diagram of a vehicle controller according to an embodiment of the present disclosure.
Figure 8:
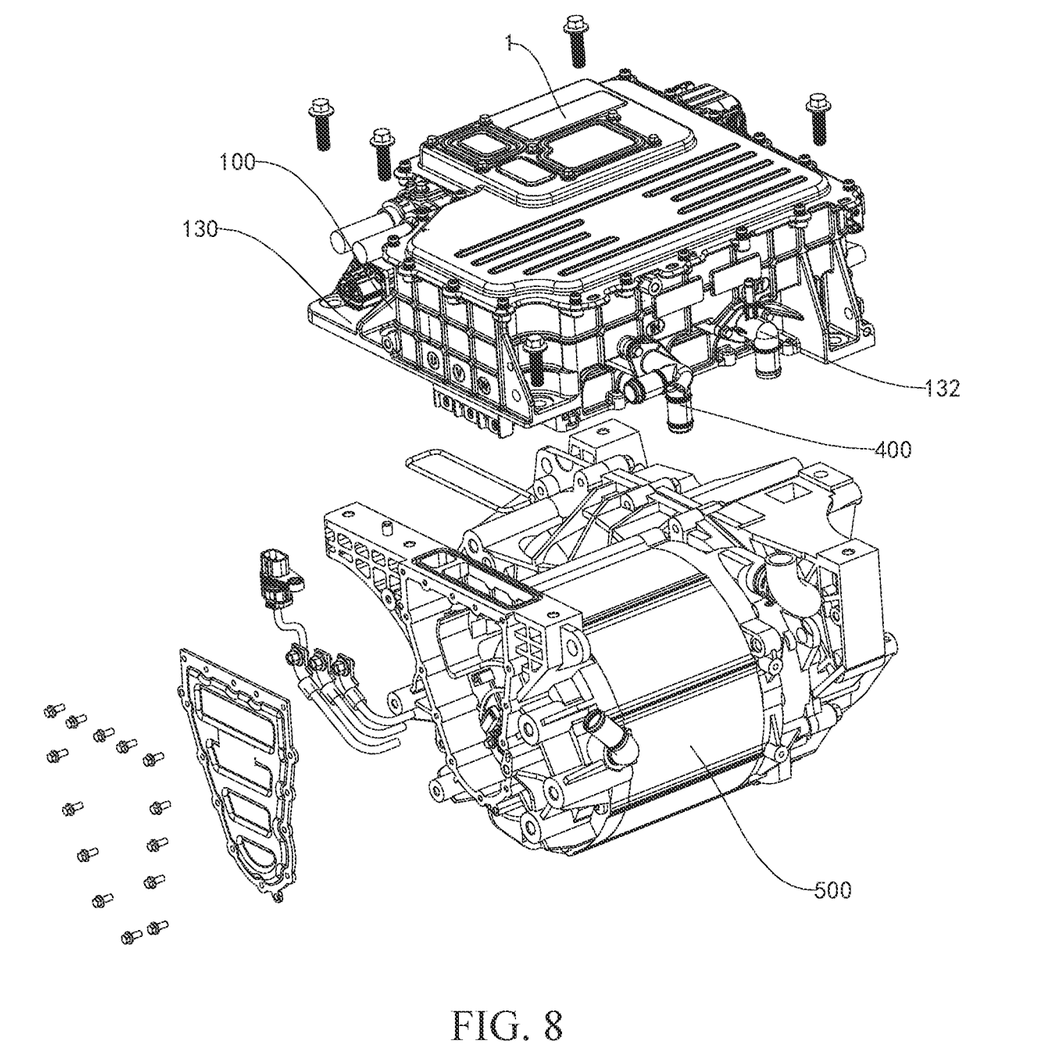
FIG. 8 is an explosive view of a vehicle controller and a power box according to an embodiment of the present disclosure.

As shown in FIG. 1 and FIG. 8, the vehicle according to an embodiment of the present disclosure includes the vehicle controller 1 according to the foregoing embodiment of the present disclosure, a power box 500, a motor, and a transmission.

The power box 500 is mounted in the vehicle controller 1, the motor and the transmission are transmission-connected and mounted in the power box 500, the motor is connected to the IGBT module 200, for example, the power box 500 is mounted on a side of the box body 130 facing away from the water channel cover plate 140, and the power box 500 can be configured to fasten and shield the motor and the transmission to avoid damage to the motor and the transmission.

The power box 500 is provided with a motor cooling water channel, and the motor cooling water channel is in communication with the control cooling water channel 111. In this way, after the coolant in the control cooling water channel 111 cools the IGBT module 200 and the power supply module 300 for heat dissipation, the coolant may be discharged through the drain hole 113e, and flow into the motor cooling water channel through the water outlet pipe 132. The motor and the transmission are cooled by the coolant in the motor cooling water channel.

Therefore, the control cooling water channel 111 and the motor cooling water channel have a relatively large space, and the coolant has a relatively long flow path, so that the coolant have a better heat dissipation effect, and overall heat dissipation efficiency of the vehicle controller 1 is higher.

The vehicle according to the embodiment of the present disclosure has advantages such as a large water channel space, high cooling efficiency and a good cooling effect, and a good shielding effect by having the vehicle controller 1 according to the foregoing embodiment of the present disclosure.

The following describes the flow path of the coolant in the vehicle controller 1 with reference to the accompanying drawings.

First, the coolant is input from the water inlet pipe 400, enters the IGBT cooling layer 112 through the water inlet section 115, and flows to the transition section 114 after cooling the IGBT module 200 in the IGBT cooling layer 112.

Then, the coolant flows into the power supply cooling layer 113 from the transition section 114, and flows through the fifth section 113a, the sixth section 113b, and the seventh section 113c in sequence in the power supply cooling layer 113, dissipates heat of the power supply module 300, and then flows to the drain hole 113e through the drain section 113d.

Finally, the coolant is discharged from the drain hole 113e, and is discharged to the water outlet pipe 132 via the water outlet section 131. The water outlet pipe 132 is in communication with the motor cooling water channel, and the coolant flows into the motor cooling water channel to dissipate heat of the motor and the transmission.

Other compositions and operations of the vehicle controller 1 and the vehicle having same according to the embodiments of the present disclosure are known to those of ordinary skills in the art, and are not described herein again in detail.

In the description of this specification, description of reference terms such as "a specific embodiment" or "a specific example", means including features, structures, materials, or features described in the embodiment or example in at least one embodiment or example of the present disclosure. In this specification, exemplary descriptions of the foregoing terms do not necessarily refer to the same embodiment or example.

Although the embodiments of the present disclosure have been shown and described, a person of ordinary skill in the art should understand that various changes, modifications, replacements and variations may be made to the embodiments without departing from the principles and spirit of the present disclosure, and the scope of the present disclosure is as defined by the appended claims and their equivalents.

REFERENCE NUMERALS

Vehicle controller 1,
control box 100, first outer surface 110, control cooling water channel 111, IGBT cooling layer 112, power supply cooling layer 113, fifth section 113a, sixth section 113b, seventh section 113c, drain section 113d, drain hole 113e, transition section 114, third section 114a, fourth section 114b, water inlet section 115, first section 115a, second section 115b,
second outer surface 120, shielding cavity 121, first shielding rib 122, second shielding rib 123, first shielding cavity 124, second shielding cavity 125, third shielding cavity 126,
box body 130, water outlet pipe 132,
water channel cover plate 140, application well 141, mounting surface 142, sealing groove 143, sealing ring 144, cover portion 145, plug-in portion 146,
IGBT module 200,
power supply module 300, MOS transistor 310, transformer 320, transformer inductor 330, circuit board 340,
water inlet pipe 400, and power box 500.

What is claimed is:

1. A vehicle controller, comprising:
a control box, the control box having a plate that has a first outer surface and a second outer surface disposed opposite to each other in a thickness direction of the control box, the first outer surface comprising a control cooling water channel, the control cooling water channel comprising an Insulated Gate Bipolar Transistor (IGBT) cooling layer, a power supply cooling layer, and a transition section, wherein the IGBT cooling layer and the power supply cooling layer are stacked in the thickness direction of the control box and communicated to each other via the transition section;
an IGBT module, the IGBT module being mounted on the first outer surface, and the IGBT module extending into the IGBT cooling layer and being cooled by coolant in the IGBT cooling layer; and
a power supply module, the power supply module being mounted on the second outer surface, and the power supply module being adjacent to the power supply cooling layer and cooled by coolant in the power supply cooling layer, wherein the control box comprises:
a box body, the power supply cooling layer being disposed in the box body, and the power supply module being mounted in the box body; and
a water channel cover plate, the water channel cover plate being mounted in the box body and covering the power supply cooling layer, the water channel cover plate and the box body defining the transition section, the IGBT cooling layer being disposed in the water channel cover plate, and the IGBT module being mounted in the water channel cover plate,
wherein an application well is disposed on the water channel cover plate, the application well is in communication with the IGBT cooling layer, and the IGBT module extends into the IGBT cooling layer by using the application well,
wherein a mounting surface is disposed on a surface of the water channel cover plate facing away from the box body, the mounting surface surrounds the application well, and the IGBT module is mounted on the mounting surface, and
wherein the second outer surface comprises a plurality of shielding cavities, and each of the shielding cavities shares at least one side wall with a water channel of the power supply cooling layer.

2. The vehicle controller according to claim 1, wherein a sealing groove around the application well is disposed on the mounting surface, a sealing ring is disposed in the sealing groove, and the sealing ring seals a gap between the mounting surface and the IGBT module.

3. The vehicle controller according to claim 1, wherein the water channel cover plate comprises:
a cover portion, the cover portion being mounted in the box body and covering the power supply cooling layer, and the cover portion and the box body defining the transition section; and
a plug-in portion, the plug-in portion being connected to a surface of the cover portion facing away from the box body, the IGBT module being mounted on a surface of the plug-in portion facing away from the cover portion, and the plug-in portion and the cover portion defining the IGBT cooling layer.

4. The vehicle controller according to claim 1, wherein
the control cooling water channel further comprises a water inlet section, and the water inlet section is connected to an end of the IGBT cooling layer away from the transition section;
the control box is connected to a water inlet pipe, and the water inlet pipe is in communication with the water inlet section;
the water inlet section comprises a first section and a second section, the first section is in communication with the water inlet pipe, and two ends of the second section are connected to the first section and the IGBT cooling layer; and
the first section is offset from the IGBT cooling layer to the second outer surface in the thickness direction of the control box.

5. The vehicle controller according to claim 4,
wherein a first portion of the second section is disposed on the box body and a second portion of the second section is disposed on the water channel cover plate.

6. The vehicle controller according to claim 1, wherein the transition section comprises a third section and a fourth section, the third section is in communication with the power supply cooling layer, and two ends of the fourth section are respectively in communication with the third section and the IGBT cooling layer;
wherein the third section is offset from the IGBT cooling layer to the second outer surface in the thickness direction of the control box.

7. The vehicle controller according to claim 6, wherein:
the fourth section is disposed on the water channel cover plate, and the third section is disposed on the box body and covered by the water channel cover plate; and
a depth of the third section is less than a depth of the power supply cooling layer.

8. The vehicle controller according to claim 7, wherein
the power supply cooling layer comprises a fifth section, a sixth section, a seventh section, and a drain section that are connected, the fifth section is connected to the transition section, the fifth section and the seventh section are parallel to each other, the sixth section is connected between the fifth section and the seventh section and is disposed obliquely to the fifth section and the seventh section, a first end of the drain section is connected to the seventh section, and a drain hole is disposed on a second end of the drain section; and
a water outlet section and a water outlet pipe are disposed in the box body, and the drain hole is in communication with the water outlet pipe via the water outlet section.

9. The vehicle controller according to claim 8, wherein
a first shielding rib and a second shielding rib are disposed on the second outer surface, the first shielding rib is located on a side of the fifth section facing away from the seventh section, and the second shielding rib is located on a side of the seventh section facing away from the fifth section; and
the first shielding rib and the fifth section form a first shielding cavity, the second shielding rib and the seventh section form a second shielding cavity, the power supply module comprises a plurality of MOS transistors, and the MOS transistors are located in the first shielding cavity and the second shielding cavity.

10. The vehicle controller according to claim 9, wherein
the fifth section, the sixth section, and the seventh section form a third shielding cavity, the power supply module further comprises a transformer and a transformer inductor, and the transformer and the transformer inductor are located in the third shielding cavity; and
the MOS transistors, the transformer, and the transformer inductor are disposed on a circuit board, and the circuit board covers the first shielding cavity, the second shielding cavity, and the third shielding cavity.

11. A vehicle, comprising:
a vehicle controller, comprising:
a control box, the control box having a plate that has a first outer surface and a second outer surface disposed opposite to each other in a thickness direction of the control box, the first outer surface comprising a control cooling water channel, the control cooling water channel comprising an Insulated Gate Bipolar Transistor (IGBT) cooling layer, a power supply cooling layer, and a transition section, wherein the IGBT cooling layer and the power supply cooling layer are stacked in the thickness direction of the control box and communicated to each other by using the transition section;
an IGBT module, the IGBT module being mounted on the first outer surface, and the IGBT module extending into the IGBT cooling layer and being cooled by coolant in the IGBT cooling layer; and
a power supply module, the power supply module being mounted on the second outer surface, and the power supply module being adjacent to the power supply cooling layer and cooled by coolant in the power supply cooling layer, wherein the control box comprises:
a box body, the power supply cooling layer being disposed in the box body, and the power supply module being mounted in the box body; and
a water channel cover plate, the water channel cover plate being mounted in the box body and covering the power supply cooling layer, the water channel cover plate and the box body defining the transition section, the IGBT cooling layer being disposed in the water channel cover plate, and the IGBT module being mounted in the water channel cover plate,
wherein an application well is disposed on the water channel cover plate, the application well is in communication with the IGBT cooling layer, and the IGBT module extends into the IGBT cooling layer by using the application well,
wherein a mounting surface is disposed on a surface of the water channel cover plate facing away from the box body, the mounting surface surrounds the application well, and the IGBT module is mounted on the mounting surface, and wherein the second outer surface comprises a plurality of shielding cavities, and each of the shielding cavities shares at least one side wall with a water channel of the power supply cooling layer;

a power box, the power box being mounted in the vehicle controller and comprising a motor cooling water channel, and the motor cooling water channel being in communication with the control cooling water channel; and a motor and a transmission, the motor and the transmission being transmission-connected and mounted in the power box, the motor being connected to the IGBT module, and the motor and the transmission being cooled by coolant in the motor cooling water channel.

12. The vehicle according to claim 11, wherein a sealing groove around the application well is disposed on the mounting surface, a sealing ring is disposed in the sealing groove, and the sealing ring seals a gap between the mounting surface and the IGBT module.

13. The vehicle according to claim 11, wherein the water channel cover plate comprises:
   a cover portion, the cover portion being mounted in the box body and covering the power supply cooling layer, and the cover portion and the box body defining the transition section; and
   a plug-in portion, the plug-in portion being connected to a surface of the cover portion facing away from the box body, the IGBT module being mounted on a surface of the plug-in portion facing away from the cover portion, and the plug-in portion and the cover portion defining the IGBT cooling layer.

14. The vehicle according to claim 11, wherein
the control cooling water channel further comprises a water inlet section, and the water inlet section is connected to an end of the IGBT cooling layer away from the transition section;
the control box is connected to a water inlet pipe, and the water inlet pipe is in communication with the water inlet section;
the water inlet section comprises a first section and a second section, the first section is in communication with the water inlet pipe, and two ends of the second section are respectively connected to the first section and the IGBT cooling layer; and
the first section is offset from the IGBT cooling layer to the second outer surface in the thickness direction of the control box.

15. The vehicle according to claim 14,
wherein a first portion of the second section is disposed on the box body and a second portion of the second section is disposed on the water channel cover plate.

16. The vehicle according to claim 11, wherein the transition section comprises a third section and a fourth section, the third section is in communication with the power supply cooling layer, and two ends of the fourth section are respectively in communication with the third section and the IGBT cooling layer;
   wherein the third section is offset from the IGBT cooling layer to the second outer surface in the thickness direction of the control box.

\* \* \* \* \*